US012607664B2

(12) United States Patent
Lee et al.

(10) Patent No.: US 12,607,664 B2
(45) Date of Patent: Apr. 21, 2026

(54) TRANSMITTING AND RECEIVING CIRCUIT INCLUDING A CALCULATION AMPLIFIER AND TEST DEVICE INCLUDING THE SAME

(71) Applicant: SAMSUNG ELECTRONICS CO., LTD., Suwon-si (KR)

(72) Inventors: Seong Kwan Lee, Suwon-si (KR); Min Ho Kang, Suwon-si (KR); Hyung-Sun Ryu, Suwon-si (KR); Cheol Min Park, Suwon-si (KR); Jun Yeon Won, Suwon-si (KR); Jae Moo Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 80 days.

(21) Appl. No.: 18/244,559

(22) Filed: Sep. 11, 2023

(65) Prior Publication Data

US 2024/0085469 A1      Mar. 14, 2024

(30) Foreign Application Priority Data

Sep. 13, 2022    (KR) ........................ 10-2022-0114734

(51) Int. Cl.
*G01R 31/26* (2020.01)
(52) U.S. Cl.
CPC ................................ *G01R 31/2607* (2013.01)
(58) Field of Classification Search
CPC .................. G06F 3/044; G01R 31/312; G01R 31/318513; G01R 19/16585; G01R 31/31703; G01R 31/31712; G01R 35/00; H03F 3/505; H03F 1/523; H03F 3/45475; H03F 3/2171; H03F 3/245; H03F 3/195; H03F 1/3211; H03F 1/0211; H03F 3/24; H03F 3/45663
See application file for complete search history.

(56) References Cited

U.S. PATENT DOCUMENTS

| | | | | |
|---|---|---|---|---|
| 4,507,576 | A | * | 3/1985 | McCracken ..... G01R 31/31924 |
| | | | | 326/63 |
| 4,947,113 | A | * | 8/1990 | Chism ...................... H03K 5/12 |
| | | | | 327/170 |
| 6,232,815 | B1 | | 5/2001 | Turvey |
| 6,275,023 | B1 | | 8/2001 | Oosaki et al. |

(Continued)

FOREIGN PATENT DOCUMENTS

| | | |
|---|---|---|
| JP | H06-308193 A | 11/1994 |
| JP | 1999-237438 A | 8/1999 |

(Continued)

*Primary Examiner* — Vinh P Nguyen
(74) *Attorney, Agent, or Firm* — Muir Patent Law, PLLC

(57) ABSTRACT

A transmitting and receiving circuit may include a first CMOS inverter configured to receive a first power supply signal and a first input signal. The transmitting and receiving circuit may include a first calculation amplifier including a non-inverted input terminal connected to an output terminal of the first CMOS inverter, and a first resistor connected between the output terminal of the first calculation amplifier and a first node. The output terminal of the first calculation amplifier and an inverted input terminal of the first calculation amplifier may be connected to each other. A first output signal may have a level smaller than that of the first input signal and may be output to the first node.

19 Claims, 9 Drawing Sheets

(56) References Cited

U.S. PATENT DOCUMENTS

| | | | |
|---|---|---|---|
| 6,472,905 B1 | 10/2002 | Manning | |
| 7,323,898 B2 | 1/2008 | Sartschev | |
| 8,643,407 B2 | 2/2014 | Reese et al. | |
| 9,164,158 B2 | 10/2015 | Johnson et al. | |
| 9,853,632 B2 * | 12/2017 | Hu | H03K 5/15 |
| 10,304,708 B2 | 5/2019 | Kim et al. | |
| 10,476,457 B2 * | 11/2019 | Schober | H03F 1/083 |
| 2010/0030508 A1 | 2/2010 | Gake | |

FOREIGN PATENT DOCUMENTS

| | | | |
|---|---|---|---|
| JP | 2003-216256 A | 7/2003 | |
| JP | 2004-527179 A | 9/2004 | |
| JP | 2006-211448 A | 8/2006 | |
| KR | 10-2012-0051072 A | 5/2012 | |
| KR | 10-2014-0032892 A | 3/2014 | |

* cited by examiner

TRANSMITTING AND RECEIVING CIRCUIT INCLUDING A CALCULATION AMPLIFIER AND TEST DEVICE INCLUDING THE SAME

CROSS-REFERENCE TO RELATED APPLICATION

Korean Patent Application No. 10-2022-0114734, filed on Sep. 13, 2022, in the Korean Intellectual Property Office, is incorporated by reference herein in its entirety.

BACKGROUND

1. Field

A transmitting and receiving circuit and a test device including the same is disclosed.

2. Description of the Related Art

After a semiconductor element is fabricated, electrical characteristics are tested to check whether there is any abnormality in normal operation. Such a test process is performed by a semiconductor test device that tests the semiconductor element via a probe card or the like. Such a semiconductor test device may include a semiconductor element, which is a test target device, and a transmitting and receiving circuit for transmitting and receiving a test signal.

SUMMARY

Embodiments are directed a transmitting and receiving circuit. The transmitting and receiving circuit may include a first CMOS inverter configured to receive a first power supply signal and a first input signal, a first calculation amplifier including a non-inverted input terminal connected to an output terminal of the first CMOS inverter, and a first resistor connected between the output terminal of the first calculation amplifier and a first node. The output terminal of the first calculation amplifier and an inverted input terminal of the first calculation amplifier may be connected to each other, and a first output signal may have a level smaller than that of the first input signal and may be output to the first node.

Embodiments are also directed to a transmitting and receiving circuit. The transmitting and receiving circuit may include a level shifter configured to change a level of a received first input signal using a first drive signal and a second drive signal, a first node which may be connected to an output terminal of the level shifter and from which a level conversion signal may be output, a first calculation amplifier including a non-inversion terminal connected to the first node, and an output terminal and an inversion terminal connected together. A first resistor may be connected to an output terminal of the first calculation amplifier, a second node may be connected to the first resistor and configured to output a first output signal. A hysteresis comparator may compare the level conversion signal received by being connected to the first node with a second input signal received by being connected to the second node to output a second output signal. A level of the first input signal may be the same as a level of the second output signal. The level of the first input signal may be greater than the levels of the first output signal, the level conversion signal, and the second input signal.

Embodiments are also directed to a test device. The test device may include a transmitting and receiving circuit which transmits and receives signals to and from a test target device and a processor that controls the transmitting and receiving circuit. The transmitting and receiving circuit may include a first CMOS inverter that may convert a level of a first input signal received from the processor using a first drive signal, an RC filter connected to a gate of a NMOS transistor of the first CMOS inverter, and a voltage divider including a first resistor and a second resistor, the voltage divider configured to output a level conversion signal obtained by reducing a level of an output signal of the first CMOS inverter. The transmitting and receiving circuit may include a first calculation amplifier configured to receive a level conversion signal at a non-inverted input terminal from the voltage divider, the first calculation amplifier including an output terminal and an inverted input terminal connected to each other. The transmitting and receiving circuit may include a third resistor placed between an output terminal of the first calculation amplifier and input and output terminals of the test target device. The transmitting and receiving circuit may include a hysteresis comparator configured to compare a second input signal output by the test target device with the level conversion signal, and output a first output signal to the processor. The level of the first input signal may be the same as the level of the first output signal. The level of the first input signal may be greater than the level of the second input signal and the level of the level conversion signal.

BRIEF DESCRIPTION OF THE DRAWINGS

Features will become apparent to those of skill in the art by describing in detail exemplary embodiments with reference to the attached drawings in which:

FIG. 2 is a diagram for explaining the transmitting and receiving circuit according to example embodiments.

FIG. 3 is a diagram for explaining a transmitting and receiving circuit according to example embodiments.

FIG. 4 is a diagram for explaining a transmitting and receiving circuit according to example embodiments.

FIG. 5 is a diagram for explaining a transmitting and receiving circuit according to example embodiments.

FIG. 6 is a diagram for explaining a transmitting and receiving circuit according to example embodiments.

FIG. 7 is a diagram for explaining a transmitting and receiving circuit according to example embodiments.

FIGS. 8 and 9 are diagrams for explaining the operation of the transmitting and receiving circuit according to example embodiments.

DETAILED DESCRIPTION

Figure 1:
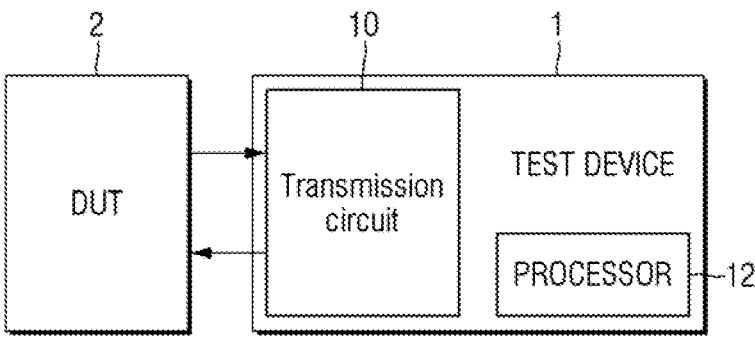
FIG. 1 is a diagram for explaining a test device and a test target device according to example embodiments.

FIG. 1 is a diagram for explaining a test device and a test target device according to example embodiments.

Referring to FIG. 1, a test device 1 according to example embodiments may test a test target device 2. In an implementation, the test target device 2 may include an image sensor. The test target device 2 may be a semiconductor device including the image sensor.

The test device 1 may transmit and receive signals to and from the test target device 2, using a transmitting and receiving circuit 10. In an implementation, the test device 1 may output a test signal to the test target device 2 using the transmitting and receiving circuit 10. The test device 1 may receive input of a signal corresponding to the test signal from the test target device 2, using the transmitting and receiving circuit 10. Signals input to or output from the test device 1 and the test target device 2 may have different levels from each other. In an implementation, the level of the signal output by the test target device 2 may be lower than the level of the signal used by the test device 1. In another example, the level of the signal output by the test device 1 may be higher than the level of the signal used by the test target device 2. Therefore, the transmitting and receiving circuit 10 may convert the level of the signal transmitted and received between the test device 1 and the test target device 2. This will be explained below in detail with reference to FIGS. 2 to 7.

Figure 2:
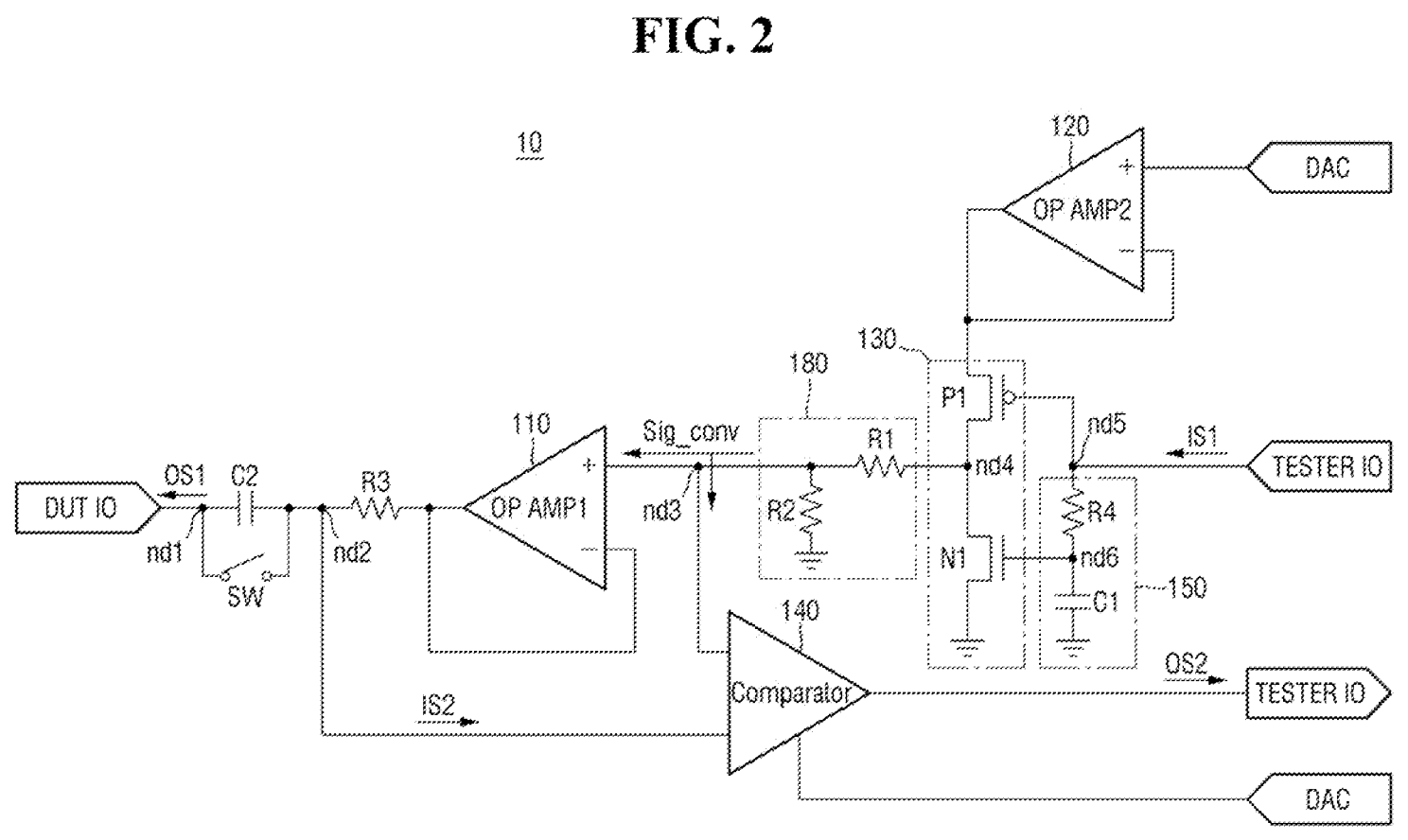

FIG. 2 is a diagram for explaining the transmitting and receiving circuit according to example embodiments.

Referring to FIGS. 1 and 2, the transmitting and receiving circuit 10 may include a first calculation amplifier 110, a second calculation amplifier 120, a first CMOS inverter 130, a comparator 140, an RC filter 150, a voltage divider 180, a third resistor R3, and a switch SW.

The first calculation amplifier 110 may be connected to a first node nd1 and a second node nd2. The first calculation amplifier 110 may be connected to the second node nd2 with the third resistor R3 interposed therebetween.

The first calculation amplifier 110 may have an output terminal and an inverted input terminal connected to each other. Therefore, the signal output from the first calculation amplifier 110 may be input to the first calculation amplifier 110 again as an inverted input signal.

The first calculation amplifier 110 may receive signals from the first CMOS inverter 130 and the voltage divider 180. Specifically, the first calculation amplifier 110 may receive a level conversion signal Sig_conv at a non-inverted input terminal through the first CMOS inverter 130 and the voltage divider 180.

The first calculation amplifier 110 may output a signal having the same level as the level conversion signal Sig_conv. The impedance of the signal output by the first calculation amplifier 110 may be 0 to 1.

The third resistor R3 may be connected to an output terminal of the first calculation amplifier 110. The third resistor R3 may be placed between the second node nd2 and the first calculation amplifier 110.

The third resistor R3 may change the impedance of the signal that is output from the first calculation amplifier 110 and has an impedance of '0 to 1'. A signal that is output from the first calculation amplifier 110 and passes through the third resistor R3 may have an impedance other than '0 to 1' at the second node nd2. In an implementation, the third resistor R3 may include a resistor of 50 ohm magnitudes. A first output signal OS1 that passes through the third resistor R3 and is output to the test target device 2 may have an impedance of 50 ohms.

The level conversion signal Sig_conv may have the same level as the first output signal OS1. Since the first calculation amplifier 110 outputs a signal of the same level as the received level conversion signal Sig_conv, and changes only the impedance of the signal, the level of the level conversion signal Sig_conv may be the same as the level of the first output signal OS1. In an implementation, the level of the level conversion signal Sig_conv and the level of the first output signal OS1 may be greater than 0V and smaller than 1V.

The second calculation amplifier 120 may provide a drive signal to the first CMOS inverter 130. In an implementation, the second calculation amplifier 120 may provide a first power supply signal to the first CMOS inverter 130.

The second calculation amplifier 120 may output a signal to the first PMOS transistor P1 of the first CMOS inverter 130. In an implementation, the second calculation amplifier 120 may provide the first power supply signal to the source of the first PMOS transistor P1 of the first CMOS inverter 130.

The second calculation amplifier 120 may receive a signal at a non-inverted input terminal from a digital-to-analog converter (DAC). In an implementation, the second calculation amplifier 120 may receive a second power supply signal at the non-inverted input terminal from the digital-to-analog converter (DAC). At this time, the digital-to-analog converter (DAC) may provide the second calculation amplifier 120 with the second power supply signal obtained by converting the signal used in the test device 1.

The second calculation amplifier 120 may have the output terminal and the inverted input terminal connected to each other. Therefore, the signal output from the second calculation amplifier 120 may be input to the second calculation amplifier 120 again as an inverted input signal.

The second calculation amplifier 120 may amplify the signal provided from the digital-to-analog converter (DAC) and output a signal having a higher level than the signal provided from the digital-to-analog converter (DAC). In an implementation, the second calculation amplifier 120 may provide the first power supply signal having a higher level than the second power supply signal to the first CMOS inverter 130, using the second power supply signal provided from the digital-to-analog converter (DAC).

The first CMOS inverter 130 may convert the level of the input signal. In an implementation, the first CMOS inverter 130 may include a first PMOS transistor P1 and a first NMOS transistor N1.

A source of the first PMOS transistor P1 may be connected to the second calculation amplifier 120. A drive signal may be provided to the source of the first PMOS transistor P1 from the second calculation amplifier 120. In an implementation, the first power supply signal may be provided to the source of the first PMOS transistor P1 from the second calculation amplifier 120.

A gate of the first PMOS transistor P1 may be connected to a fifth node nd5. The signal provided by the test device 1 to the test target device 2 may be output to the fifth node nd5. A first input signal IS1 provided by the test device 1 through the fifth node nd5 may be provided to the gate of the first PMOS transistor P1. In an implementation, the first input signal IS1 provided by the test device 1 to the test target device 2 may be provided to the gate of the first PMOS transistor P1.

A drain of the first PMOS transistor P1 may be connected to the first NMOS transistor N1. In an implementation, the drain of the first PMOS transistor P1 may be connected to a drain of the first NMOS transistor N1 through the fourth node nd4. Also, the drain of the first PMOS transistor P1 may be connected to the voltage divider 180. A source of the first NMOS transistor N1 may be connected to a ground voltage.

The source of the first NMOS transistor N1 may be connected to the ground voltage. In some embodiments, the source of the first NMOS transistor N1 may not be connected to the ground voltage.

A gate of the first NMOS transistor N1 may be connected to the RC filter 150. The gate of the first NMOS transistor N1 may be connected to a sixth node nd6. The gate of the first NMOS transistor N1 may be connected between the fourth resistor R4 of the RC filter 150 and the first capacitor C1. The gate of the first NMOS transistor N1 may be connected to the sixth node nd6 between the fourth resistor R4 of the RC filter 150 and the first capacitor C1.

The gate of the first NMOS transistor N1 may be connected to the RC filter 150. In some embodiments, the gate of the first NMOS transistor N1 may not be connected to the RC filter 150. In an implementation, the gate of the first NMOS transistor N1 may be directly connected to the fifth node nd5 without the RC filter 150. A control signal may be input to the test device 1. The first input signal IS1 of the test device 1 may be provided to the gate of the first NMOS transistor N1 through the fifth node nd5.

A drain of the first NMOS transistor N1 may be connected to the first PMOS transistor P1. In an implementation, the drain of the first NMOS transistor N1 may be connected to the drain of the first PMOS transistor P1 through the fourth node nd4. Also, the drain of the first NMOS transistor N1 may be connected to the voltage divider 180.

The RC filter 150 may correct a speed deviation between the first PMOS transistor P1 and the first NMOS transistor N1 of the first CMOS inverter 130. The speed of the first NMOS transistor N1 may be faster than that of the first PMOS transistor P1. At this time, the RC filter 150 may correct a non-uniform signal generated due to the speed deviation between the first PMOS transistor P1 and the first NMOS transistor N1.

The comparator 140 may be connected to the second node nd2 and the third node nd3. In an implementation, a first input terminal of the comparator 140 may be connected to the second node nd2. A signal that is input by the test target device 2 to the receiving circuit 10 may be output to the second node nd2. In an implementation, a second input signal IS2 provided by the test target device 2 to the receiving circuit 10 may be output to the second node nd2. The second input signal IS2 may be provided to the first input terminal of the comparator 140 from the second node nd2.

A second input terminal of the comparator 140 may be connected to the third node nd3. The third node nd3 may be placed between the first calculation amplifier 110 and the first CMOS inverter 130. A level conversion signal Sig_conv that is output from the first CMOS inverter 130 and the voltage divider 180 may be output to the third node nd3. The level conversion signal Sig_conv may be input to the second input terminal of the comparator 140 from the third node nd3.

The comparator 140 may compare two input signals and output a signal. In an implementation, the comparator 140 may output the second output signal OS2, using the second input signal IS2 that is input to the first input terminal, and the level conversion signal Sig_conv that is input to the second input terminal. At this time, the second output signal OS2 may include a signal indicating the result corresponding to the first input signal IS1 provided to the test target device 2 by the test device 1. The comparator 140 may provide the second output signal OS2 to the processor of the test device 1.

The level of the second input signal IS2 may be smaller than the level of the second output signal OS2. In an implementation, the level of the second input signal IS2 may be greater than 0V and smaller than 1V. The level of the second input signal IS2 may be the same as the level of the level conversion signal Sig_conv.

The levels of the second output signal OS2 and the first input signal IS1 may be the same. That is, the levels of the signals used inside the test device 1 may be constant. In some embodiments, the levels of the second output signal OS2 and the first input signal IS1 may not be the same. That is, the levels of the signals used inside the test device 1 may not be constant.

The comparator 140 may include a hysteresis comparator. That is, the comparator 140 may have a hysteresis function. As a result, even if the second input signal IS2 provided by the test target device 2 includes noise, the test target device 2 may stably operate.

The voltage divider 180 may be connected to the first calculation amplifier 110 and the first CMOS inverter 130. The voltage divider 180 may receive a signal from the first CMOS inverter 130. The voltage divider 180 may output the signal to the first calculation amplifier 110. The voltage divider 180 may reduce the level of the signal that is input from the first CMOS inverter 130. The voltage divider 180 may provide the level conversion signal Sig_conv of the reduced level to the non-inverted input terminal of the first calculation amplifier 110. The voltage divider 180 may additionally reduce the level of the signal converted by first CMOS inverter 130.

The level conversion signal Sig_conv may have a level lower than the first input signal IS1 provided by the test device 1. The voltage divider 180 may include a first resistor R1 and a second resistor R2. The second resistor R2 may be connected to the ground voltage. In some embodiments, the second resistor R2 may not be connected to the ground voltage. The first calculation amplifier 110 may be connected between the first resistor R1 and the second resistor R2.

The switch SW may be placed between the first node nd1 and the second node nd2. Specifically, the second capacitor C2 may be placed between the first node nd1 and the second node nd2. The switch SW may be placed in parallel with the second capacitor C2. When the switch SW is in an OFF state, signals may be transmitted and received via the second capacitor C2. When the switch SW is in an ON state, signals may be transmitted and received through a transmission line closed by the switch SW without passing through the second capacitor C2.

The switch SW may control provision of the second input signal IS2 to the comparator 140. In an implementation, when the test device 1 is in a mode of outputting the signal to the test target device 2, the switch SW may be in the OFF state. Accordingly, the second input signal IS2 may not be provided to the comparator 140, and the first output signal OS1 provided to the test target device 2 may be output at the first node nd1.

In another example, when the test device 1 is in a mode of receiving the signals from the test target device 2, the switch SW may be in the ON state. The second input signal IS2 may be provided to the comparator 140 accordingly. The first output signal OS1 provided from the test device 1 to the test target device 2 may not be output at the first node nd1, and the second input signal IS2 provided by the test target device 2 to the test device 1 may be output at the first node nd1.

Figure 3:
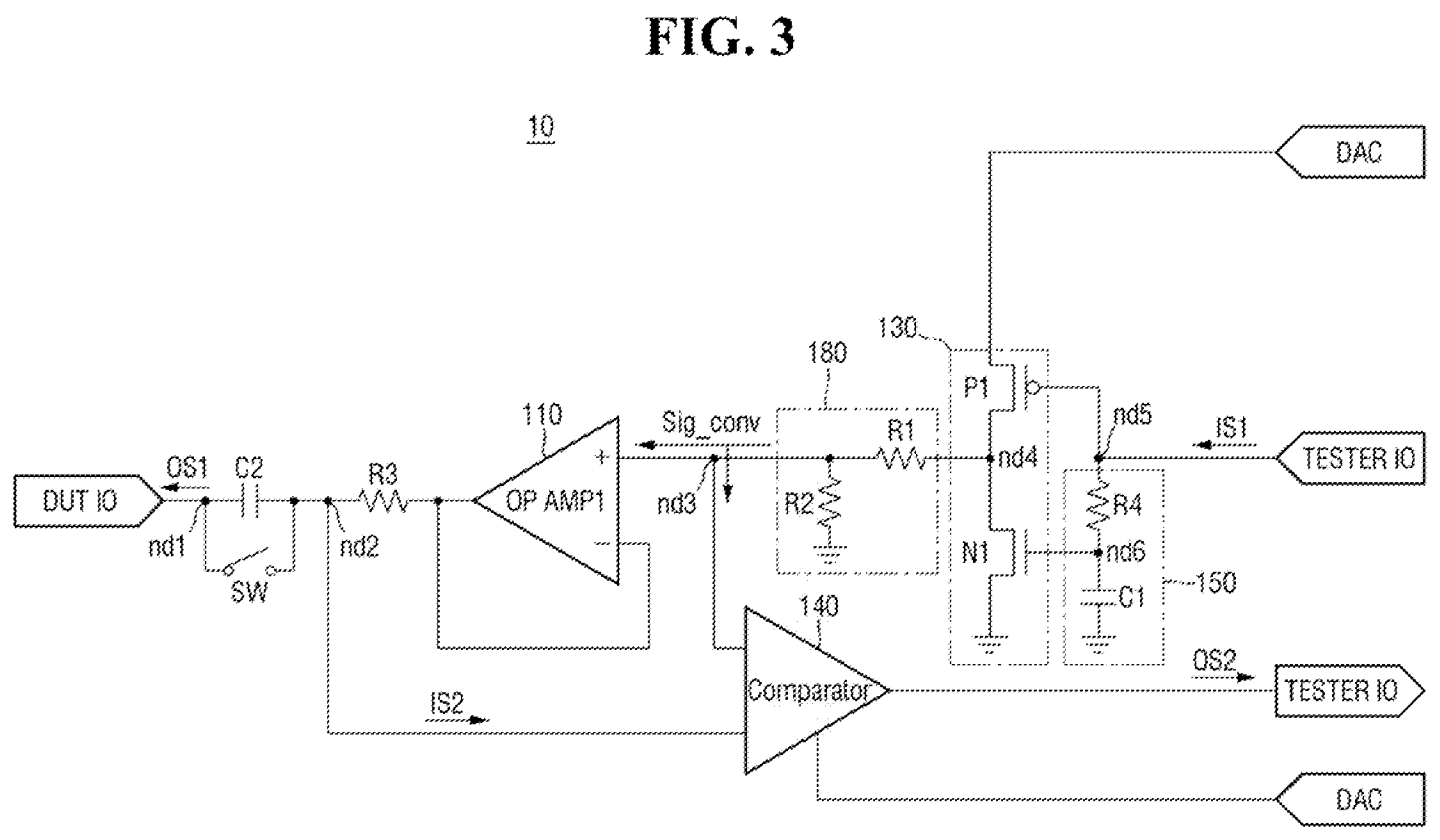

FIG. 3 is a diagram for explaining a transmitting and receiving circuit according to example embodiments. For convenience of explanation, the explanation will focus on the points different from those explained with reference to FIG. 2.

Referring to FIGS. 1 and 3, the first CMOS inverter 130 may be directly connected to the digital-to-analog converter (DAC). That is, the first CMOS inverter 130 may receive a drive signal from the digital-to-analog converter (DAC) rather than the calculation amplifier. The drive signal provided from the digital-to-analog converter (DAC) may have a level lower than that of the drive signal provided from the calculation amplifier.

Specifically, the drive signal may be provided to the source of the first PMOS transistor P1 of the first CMOS inverter 130 from the digital-to-analog converter (DAC). In an implementation, the power supply signal may be provided to the source of the first PMOS transistor P1 from the digital-to-analog converter (DAC).

Figure 4:
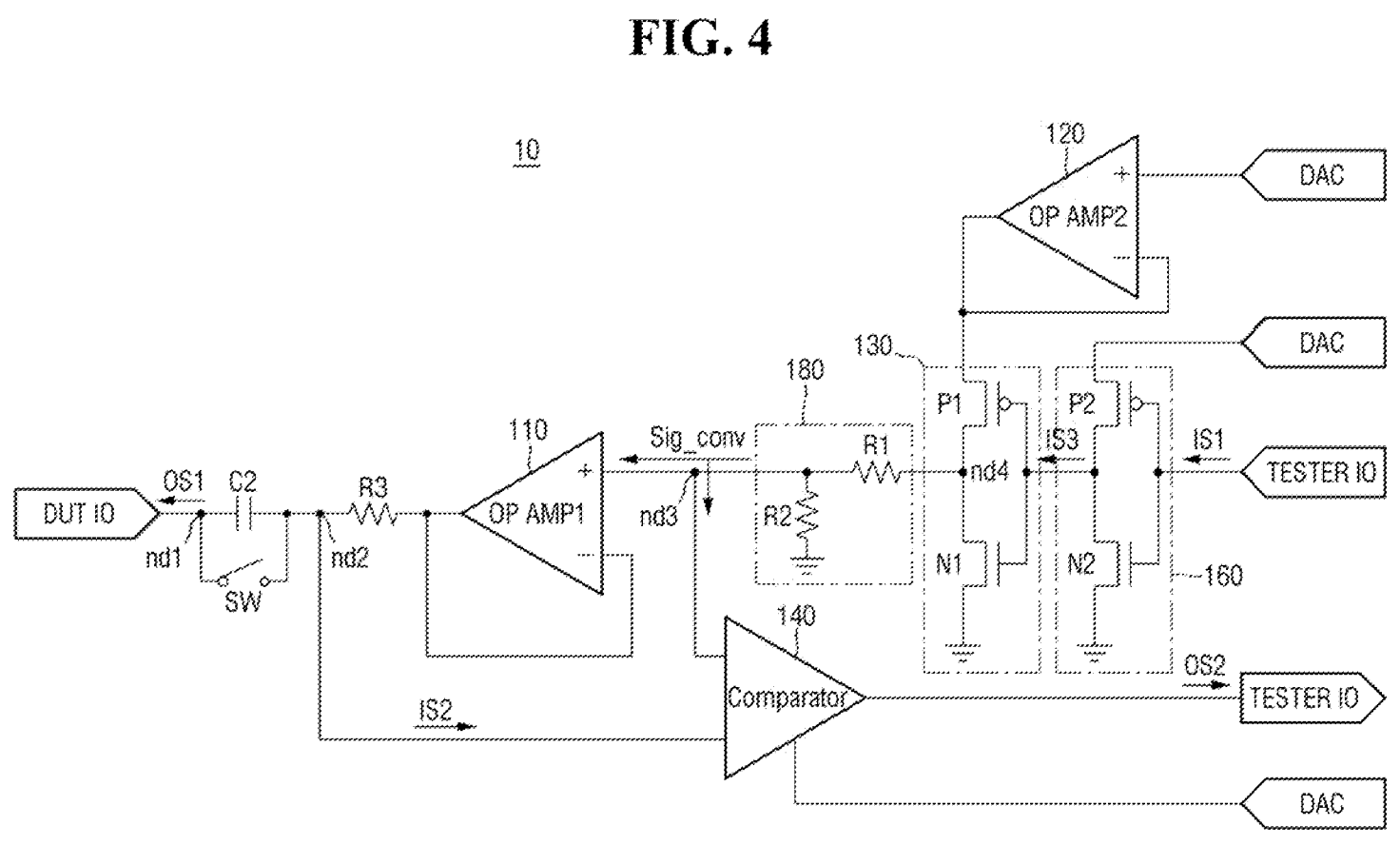

FIG. 4 is a diagram for explaining a transmitting and receiving circuit according to example embodiments. For convenience of explanation, the explanation will focus on the points different from those explained with reference to FIG. 2.

Referring to FIGS. 1 and 4, the transmitting and receiving circuit 10 may include a second CMOS inverter 160. The second CMOS inverter 160 may be connected to the first CMOS inverter 130. The second CMOS inverter 160 may output a signal to the first CMOS inverter 130. In an implementation, the second CMOS inverter 160 may output a third input signal IS3 to the first CMOS inverter 130. The first CMOS inverter 130 may change the level of the first input signal IS1 provided by the test device 1 to the test target device 2 and output the third input signal IS3.

The second CMOS inverter 160 may include a second PMOS transistor P2 and a second NMOS transistor N2. The source of the second PMOS transistor P2 may receive the drive signal from the digital-to-analog converter (DAC). The gate of the second PMOS transistor P2 may receive a first input signal IS1 provided by the test device 1 to the test target device 2. The drain of the second PMOS transistor P2 may be connected to the drain of the second NMOS transistor N2, the gate of the first PMOS transistor P1 of the first CMOS inverter 130, and the gate of the first NMOS transistor N1.

The source of the second NMOS transistor N2 may be connected to the ground voltage. In some embodiments, the source of the second NMOS transistor N2 may not be connected to the ground voltage. The gate of the second NMOS transistor N2 may receive the first input signal IS1 provided by the test device 1 to the test target device 2. The drain of the second NMOS transistor N2 may be connected to the drain of the second PMOS transistor P2, the gate of the first PMOS transistor P1 of the first CMOS inverter 130, and the gate of the first NMOS transistor N1. The second CMOS inverter 160 may correct a speed deviation between the first PMOS transistor P1 and the first NMOS transistor N1 of the first CMOS inverter 130.

Figure 5:
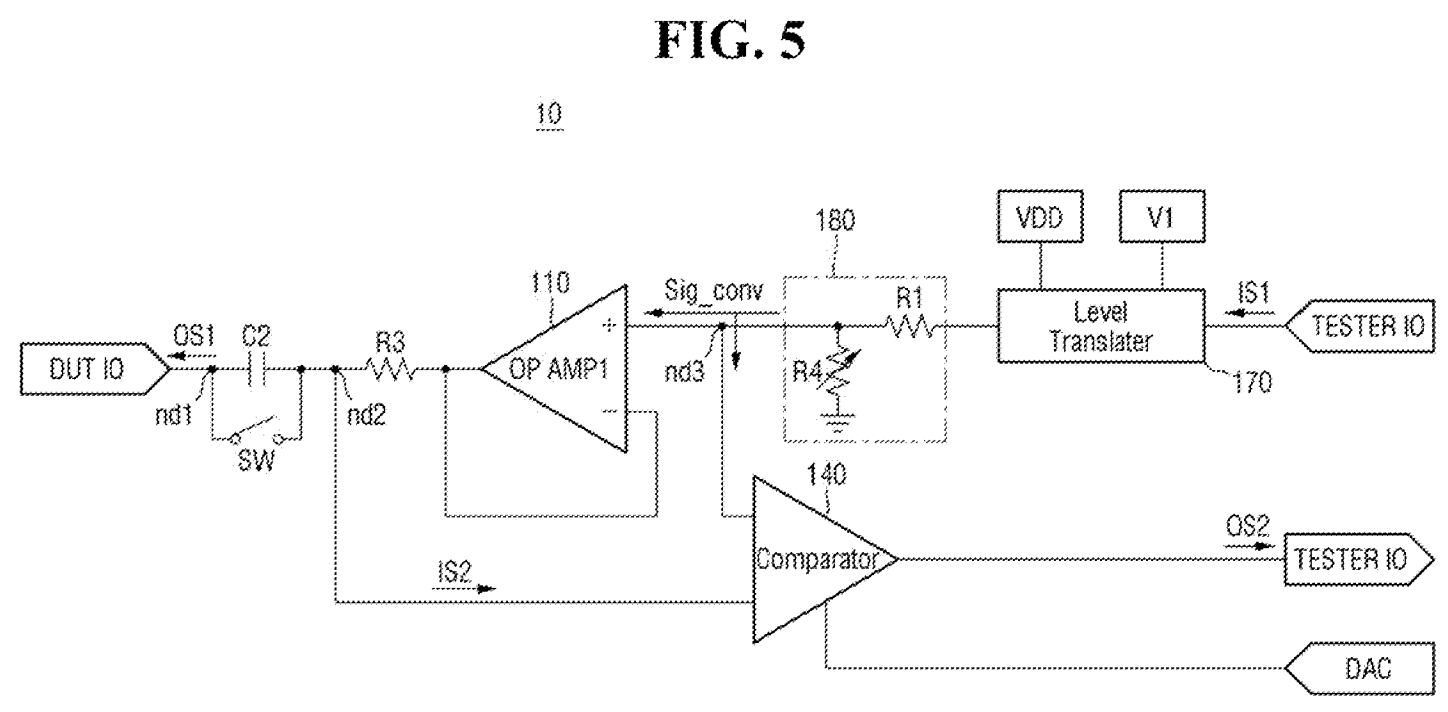

FIG. 5 is a diagram for explaining a transmitting and receiving circuit according to example embodiments. For convenience of description, the description will focus on points that are different from those described with reference to FIGS. 2 to 4.

Referring to FIGS. 1 and 5, the transmitting and receiving circuit 10 according to example embodiments may include a first calculation amplifier 110, a comparator 140, a level shifter 170, and a voltage divider 180.

The level shifter 170 may receive the first input signal IS1 provided by the test device 1 to the test target device 2. The level shifter 170 may receive the power supply signal VDD and the first signal V1 as the drive signal. The power supply signal VDD may include a signal of variable level. In an implementation, the power supply signal VDD may have a non-constant voltage. Unlike the power supply signal VDD, the first signal V1 may be constant. That is, the first signal V1 may include a signal of fixed level.

The level shifter 170 may output a signal whose level is not constant. In an implementation, the level shifter 170 may output the same signal as the power supply signal VDD.

The voltage divider 180 may include a first resistor R1 and a fourth resistor R4. The first resistor R1 may include a fixed resistor. That is, the first resistor R1 may include a resistor of constant magnitude. The fourth resistor R4 may include a variable resistor. That is, the fourth resistor R4 may include a resistor of non-constant magnitude. The magnitude of the fourth resistor R4 may be set arbitrarily.

The voltage divider 180 may lower the level of the signal of non-constant level that is output from the level shifter 170. By adjusting the magnitude of the fourth resistor R4, the voltage divider 180 may output the level conversion signal Sig_conv of a constant level.

Figure 6:
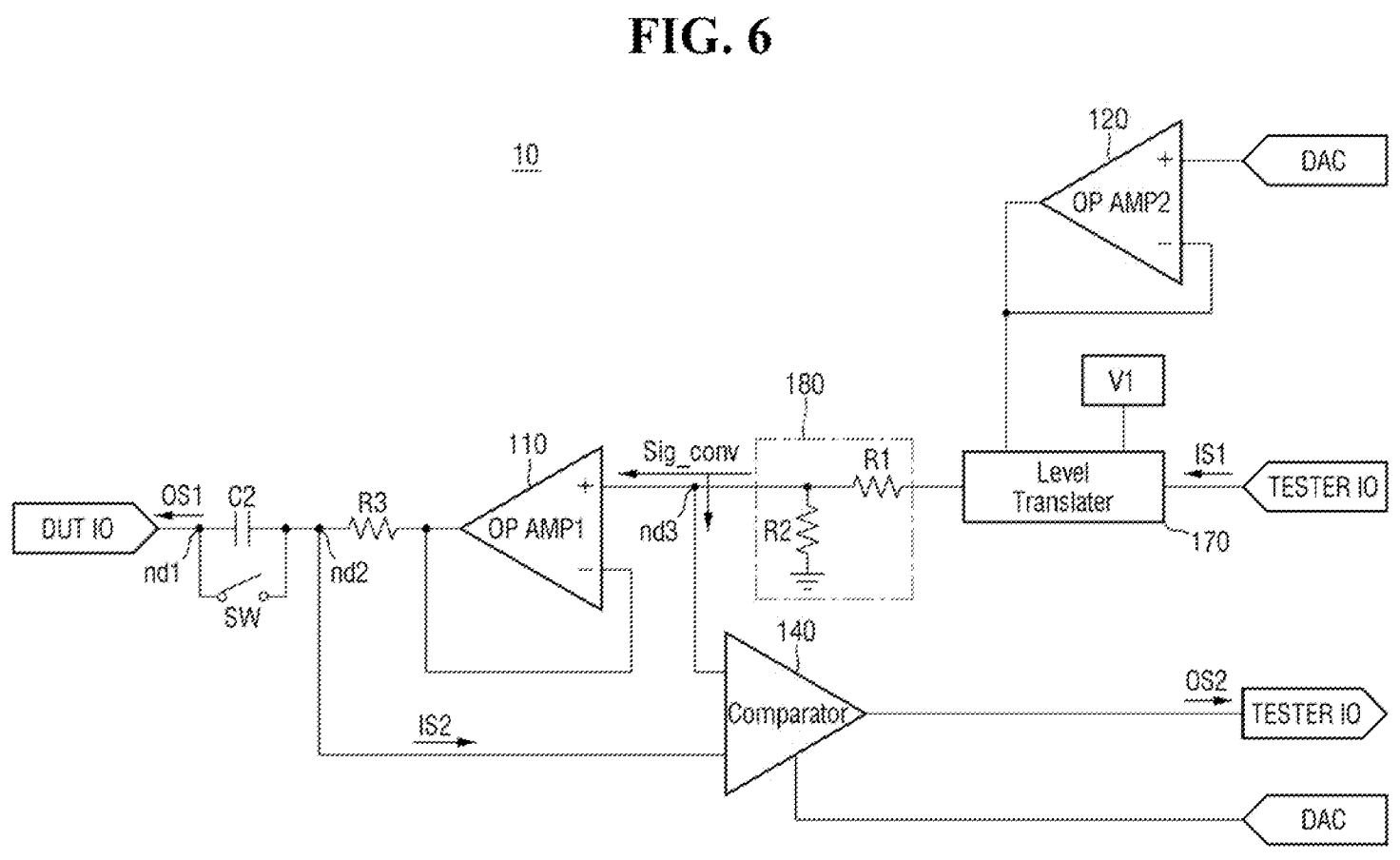

FIG. 6 is a diagram for explaining a transmitting and receiving circuit according to example embodiments. For convenience of explanation, the description will focus on points that are different from those described with reference to FIG. 5.

Referring to FIGS. 1 and 6, the level shifter 170 may receive the drive signal from the second calculation amplifier 120. The second calculation amplifier 120 may provide the first power supply signal to the level shifter 170.

The second calculation amplifier 120 may receive a signal at a non-inverted input terminal from the digital-to-analog converter (DAC). In an implementation, the second calculation amplifier 120 may receive the second power supply signal at the non-inverted input terminal from the digital-to-analog converter (DAC). At this time, the digital-to-analog converter (DAC) may provide the second calculation amplifier 120 with a second power supply signal obtained by converting the signal used in the test device 1.

The second calculation amplifier 120 may have an output terminal and an inverted input terminal connected to each other. Therefore, the signal that is output from the second calculation amplifier 120 may be input to the second calculation amplifier 120 again, as an inverted input signal.

The drive signal provided to the level shifter 170 by the second calculation amplifier 120 may have a constant level. At this time, the voltage divider 180 may include a first resistor R1 and a second resistor R2 having constant magnitudes.

The level shifter 170 and the voltage divider 180 may convert the level of first input signal IS1 provided by the test device 1 to the test target device 2. The level shifter 170 and the voltage divider 180 may convert the level and output a level conversion signal Sig_conv having a constant level.

Figure 7:
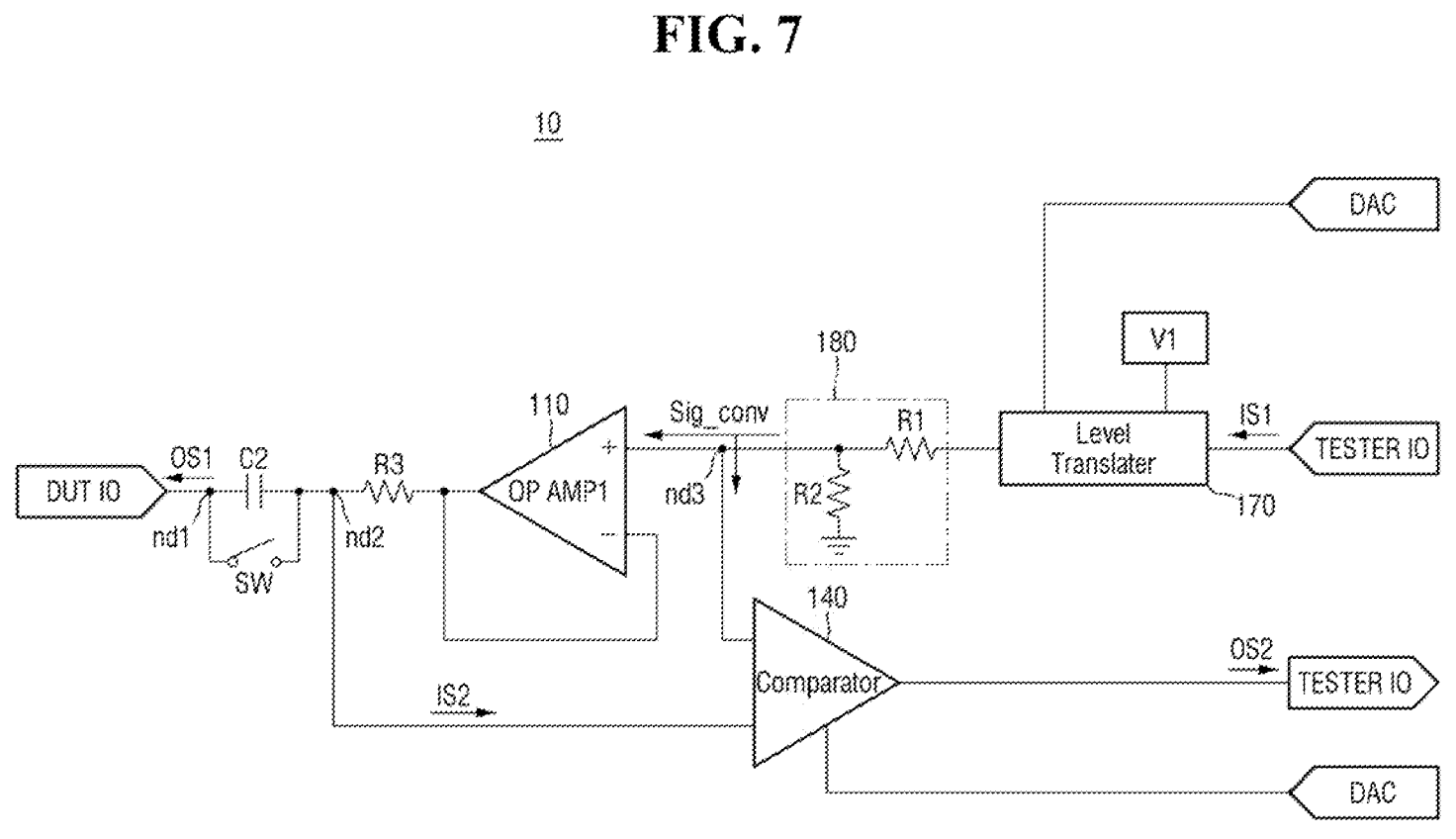

FIG. 7 is a diagram for explaining a transmitting and receiving circuit according to example embodiments. For convenience of explanation, the explanation will focus on points different from those explained with reference to FIGS. 6 and 7.

The level shifter 170 may be directly connected to the digital-to-analog converter (DAC). That is, the level shifter 170 may receive the drive signal from the digital-to-analog converter (DAC) rather than the calculation amplifier. The drive signal provided from the digital-to-analog converter (DAC) may have a level lower than that of the drive signal provided from the calculation amplifier. The signal provided from the digital-to-analog converter (DAC) may have a constant level. Therefore, the voltage divider 180 may have a fixed resistor. In an implementation, voltage divider 180 may include a first resistor R1 and a second resistor R2 of constant magnitude.

Figure 8:
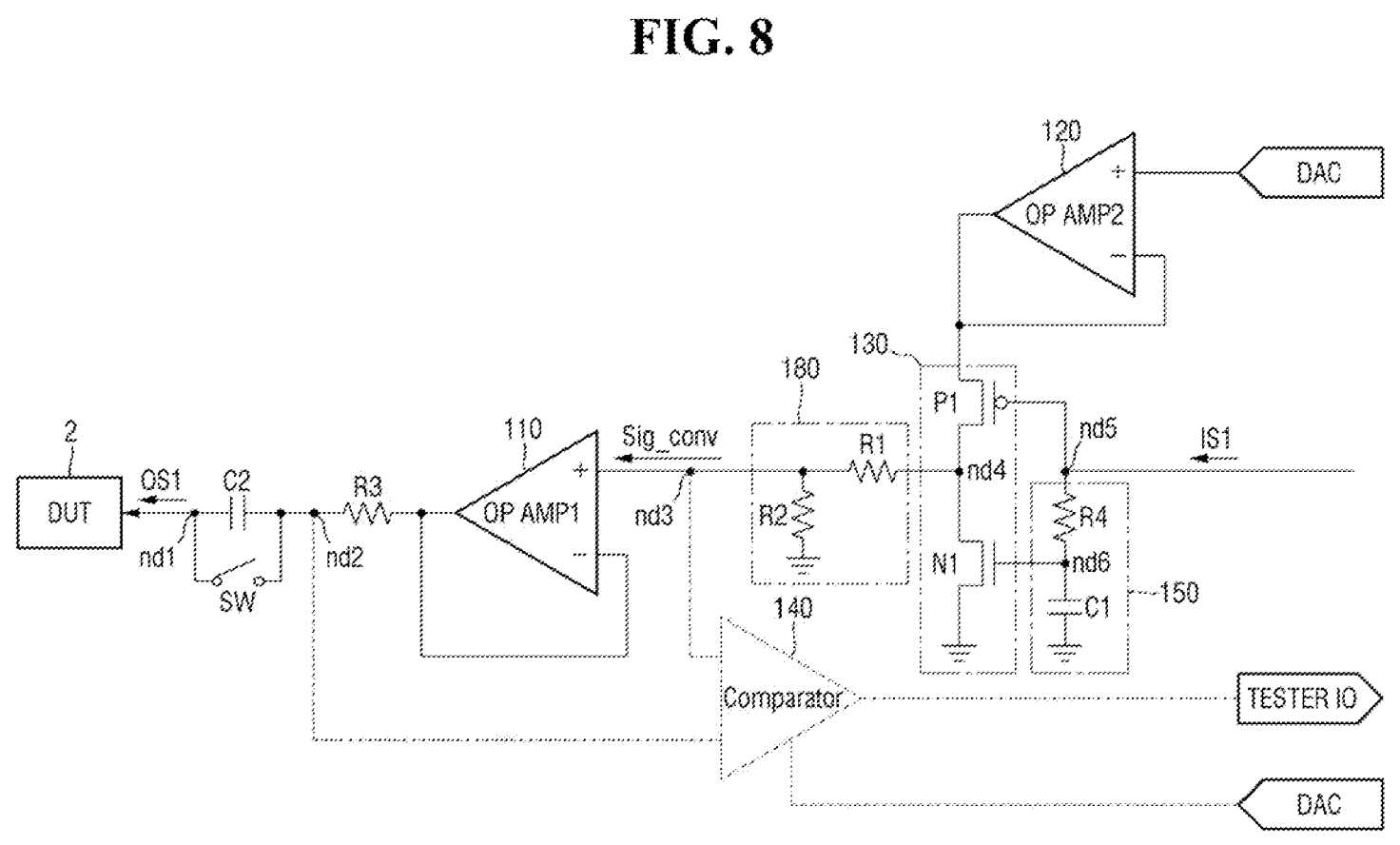
Figure 9:
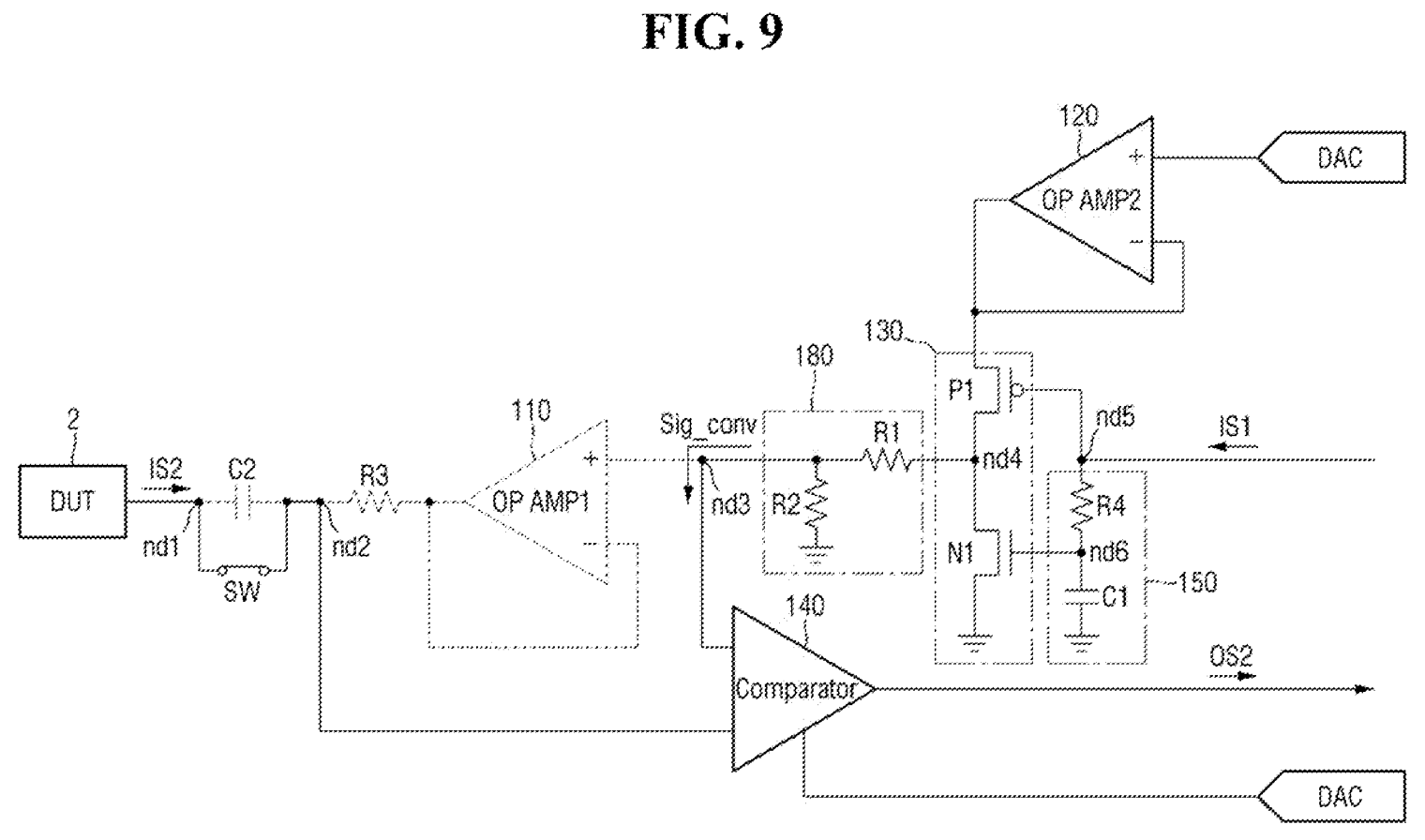

FIGS. 8 and 9 are diagrams for explaining the operation of the transmitting and receiving circuit according to example embodiments. For convenience of explanation, the explanation will focus on points different from those explained with reference to FIGS. 2 to 7. For reference, FIGS. 8 and 9 relate to an operation of the transmitting and receiving circuit according to FIG. 2.

Referring to FIGS. 1 and 8, a first input signal IS1 may be provided to the first CMOS inverter. At this time, the test device 1 may be in a mode of providing test-related signals to the test target device 2. In an implementation, the test device 1 may be in an output mode. Therefore, the switch SW may be turned off.

The first calculation amplifier 110, the second calculation amplifier 120, the first CMOS inverter 130, and the voltage divider 180 may be activated.

The second calculation amplifier 120 may convert the signal provided from the digital-to-analog converter (DAC) into the signal with increased level. The second calculation amplifier 120 may output the drive signal of the increased level to the first CMOS inverter 130.

The RC filter 150 may correct the speed deviation between the first PMOS transistor P1 and the first NMOS transistor N1 of the first CMOS inverter 130 so that the first CMOS inverter 130 outputs a uniform signal.

The first CMOS inverter 130 may convert the level of the first input signal IS1, using the drive signal provided from the second calculation amplifier 120. The first CMOS inverter 130 may output a signal obtained by converting the level of the first input signal IS1 to the voltage divider 180. The voltage divider 180 may lower the level of the signal provided from the first CMOS inverter 130. The voltage divider 180 may output a level conversion signal Sig_conv. As a result, the level conversion signal Sig_conv may be output from the third node nd3 connected to the output terminal of the voltage divider 180.

The level conversion signal Sig_conv may be provided to the non-inverted input terminal of the first calculation amplifier 110. The first calculation amplifier 110 may change the impedance of the level conversion signal Sig_conv from 0 to 1 and output it.

The third resistor R3 connected to the output terminal of the first calculation amplifier 110 may change the impedance of the signal that is output by the first calculation amplifier 110. The third resistor R3 may change the impedance of the signal that is output by the first calculation amplifier 110 to an impedance corresponding to the signal used in the test target device 2.

The signal that has passed through the first calculation amplifier 110 and the third resistor R3 may be provided as a first output signal OS1 to the test target device 2 through the second node nd2, the second capacitor C2, and the first node nd1.

The first input signal IS1, which is the signal used inside the test device 1, may not be compatible inside the test target device 2. The level and impedance of signal used in the test device 1 may differ from the level and impedance of signal used in the test target device 2. In an implementation, signal used inside the test target device 2 may have a level greater than 0V and smaller than 1V. The signal used in the test device 1 may have a level greater than that of the signal used in the test target device 2.

Therefore, the first input signal IS1 provided by the test device 1 through the first calculation amplifier 110, the second calculation amplifier 120, the first CMOS inverter 130, and the voltage divider 180 may be converted into the first output signal OS1 that may be used in the test target device 2. The first output signal OS1 may have a level smaller than the first input signal IS1. In an implementation, the first output signal OS1 may have a level greater than 0V and smaller than 1V.

Referring to FIGS. 1 and 9, the test target device 2 may output the second input signal IS2. At this time, the test device 1 may be in a mode for receiving the signal from the test target device 2. In an implementation, the test device 1 may be in an output mode. Therefore, the switch SW may be turned on.

The switch SW, the comparator 140, the voltage divider 180, the first CMOS inverter 130, and the second calculation amplifier 120 may be activated.

The second input signal IS2 provided by the test target device 2 may be provided to the transmission line connected by the switch SW without passing through the second capacitor C2. The second input signal IS2 may be provided to the comparator 140.

The level conversion signal Sig_conv that is output from the first CMOS inverter 130 and the voltage divider 180 may be provided to the comparator 140.

The comparator 140 may compare the second input signal IS2 with the level conversion signal Sig_conv to output the second output signal OS2. In an implementation, the comparator 140 may output the second output signal OS2 to the processor 12 of the test device 1.

The second input signal IS2 provided by the test target device 2 may not be compatible inside the test device 1. The second input signal IS2 may have a level smaller than that of the signal used inside the test device 1. In an implementation, the second input signal IS2 may have a level greater than 0V and smaller than 1V.

Therefore, the second input signal IS2 provided by the test target device 2 through the comparator 140, the second calculation amplifier 120, the first CMOS inverter 130 and the voltage divider 180 may be converted into the second output signal OS2 that may be used in the test device 1. The second output signal OS2 may have a level greater than that of the second input signal IS2.

By way of summation and review, the semiconductor test device may receive a signal from the test target device through the transmitting and receiving circuit, and output the signal to the test target device through the transmitting and receiving circuit. When the characteristics of the signals input and output by the semiconductor test device and the test target device are different, the transmitting and receiving circuit may convert the signals. A transmitting and receiving circuit may have improved reliability. A test device including the transmitting and receiving circuit may have improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

While example embodiments have been shown and described above, it will be apparent to those skilled in the art that modifications and variations could be made without departing from the scope of the present inventive concept as defined by the appended claims.

What is claimed is:

1. A transmitting and receiving circuit comprising:
a first CMOS inverter configured to receive a first power supply signal and receive a first input signal;
a first calculation amplifier including an output terminal and a non-inverted input terminal connected to an output terminal of the first CMOS inverter; and
a first resistor connected between the output terminal of the first calculation amplifier and a first node, wherein:
the output terminal of the first calculation amplifier and an inverted input terminal of the first calculation amplifier are connected to each other, and
wherein the first calculation amplifier is configured to output a first output signal to the first node, the first output signal having a level smaller than that of the first input signal.

2. The transmitting and receiving circuit as claimed in claim 1, wherein:
the first CMOS inverter includes a first PMOS transistor and a first NMOS transistor,
a second calculation amplifier is configured to output a first power supply signal to a source of the first PMOS transistor,
the first input signal is provided to a gate of the first PMOS transistor, and
a drain of the first PMOS transistor is connected to the non-inverted input terminal of the first calculation amplifier and a drain of the first NMOS transistor.

3. The transmitting and receiving circuit as claimed in claim 2, further comprising:
an RC filter connected to a gate of the first NMOS transistor, wherein the gate of the first NMOS transistor is connected between a resistor and capacitor of the RC filter.

4. The transmitting and receiving circuit as claimed in claim 2, wherein a source of the first NMOS transistor is connected to a ground voltage.

5. The transmitting and receiving circuit as claimed in claim 1, further comprising:
a voltage divider including a second resistor connected between the output terminal of the first CMOS inverter and the non-inverted input terminal of the first calculation amplifier.

6. The transmitting and receiving circuit as claimed in claim 5, wherein the voltage divider includes a plurality of resistors.

7. The transmitting and receiving circuit as claimed in claim 1, further comprising:
a second CMOS inverter configured to output the first input signal to an input terminal of the first CMOS inverter.

8. The transmitting and receiving circuit as claimed in claim 1, further comprising:
a voltage divider between the output terminal of the first CMOS inverter and the non-inverted input terminal of the first calculation amplifier,
a comparator including a first input terminal connected to a second node between the first node and the first resistor, and a second input terminal connected to a third node connected between the non-inverted input terminal of the first calculation amplifier and the voltage divider,
wherein the comparator is configured to compare a second input signal provided to the first input terminal with an output signal of the voltage divider provided to the second input terminal to output a second output signal.

9. The transmitting and receiving circuit as claimed in claim 8, wherein the comparator is a hysteresis comparator.

10. The transmitting and receiving circuit as claimed in claim 8, further comprising:
a capacitor between the first node and the second node, and a switch connected in parallel with the capacitor.

11. The transmitting and receiving circuit as claimed in claim 8, wherein:
the level of the first input signal, which is provided by a test device to the first CMOS inverter, is the same as the level of the second output signal, which is provided by the comparator, and
the output signal of the first CMOS inverter has a level smaller than the level of the first input signal.

12. The transmitting and receiving circuit as claimed in claim 1, further comprising:
a second calculation amplifier configured to output the first power supply signal to the first CMOS inverter, wherein:
a non-inverted input terminal of the second calculation amplifier receives a second power supply signal, and
an output terminal of the second calculation amplifier and an inverted input terminal of the second calculation amplifier are connected to each other.

13. The transmitting and receiving circuit as claimed in claim 12, wherein the output terminal of the second calculation amplifier is connected to a source of a first PMOS transistor of the first CMOS inverter.

14. The transmitting and receiving circuit as claimed in claim 1, wherein the level of the first output signal is greater than 0V and smaller than 1V.

15. A transmitting and receiving circuit controlled by a processor and transmitting and receiving signals to and from a test target device comprising:
a first CMOS inverter that converts a level of a first input signal received from the processor, using a first drive signal;
an RC filter connected to a gate of an NMOS transistor of the first CMOS inverter;
a voltage divider including a first resistor and a second resistor, the voltage divider configured to output a level conversion signal obtained by reducing a level of an output signal of the first CMOS inverter;
a first calculation amplifier configured to receive the level conversion signal at a non-inverted input terminal from the voltage divider, the first calculation amplifier including an output terminal and an inverted input terminal connected to each other;
a third resistor connected between an output terminal of the first calculation amplifier and input and output terminals of the test target device; and
a hysteresis comparator configured to compare a second input signal output by the test target device with the level conversion signal, and output a first output signal to the processor, wherein:
the level of the first input signal, which is received by the first CMOS inverter from the processor, is the same as the level of the first output signal, which is output by the hysteresis comparator, and
the level of the first input signal, which is received by the first CMOS inverter from the processor, is greater than the level of the second input signal, which is output by the test target device, and the level of the level conversion signal, which is output by the voltage divider.

16. The transmitting and receiving circuit as claimed in claim 15, wherein the level of the second input signal or the level of the level conversion signal is greater than 0V and smaller than 1V.

17. The transmitting and receiving circuit as claimed in claim 15, wherein the test target device is an image sensor.

18. The transmitting and receiving circuit as claimed in claim 15, wherein a source of the NMOS transistor is connected to a ground voltage.

19. The transmitting and receiving circuit as claimed in claim 15, further comprising a second calculation amplifier comprising an output terminal connected to the first CMOS inverter.

* * * * *